(12) United States Patent
Müller (10) Patent No.: US 10,024,345 B2
(45) Date of Patent: Jul. 17, 2018

(54) FIXING DEVICE FOR A CIRCUIT PLATE TO A CARRIER, CIRCUIT ARRANGEMENT AND METHOD FOR FIXING A CIRCUIT PLATE TO A CARRIER

(71) Applicant: ZF Friedrichshafen AG, Friedrichshafen (DE)

(72) Inventor: Karl-Heinz Müller, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 193 days.

(21) Appl. No.: 15/060,833

(22) Filed: Mar. 4, 2016

(65) Prior Publication Data

US 2016/0262280 A1 Sep. 8, 2016

(30) Foreign Application Priority Data

Mar. 6, 2015 (DE) .................. 10 2015 204 120

(51) Int. Cl.
*F16B 5/02* (2006.01)
*H05K 7/14* (2006.01)

(52) U.S. Cl.
CPC .......... *F16B 5/0258* (2013.01); *F16B 5/0233* (2013.01); *H05K 7/142* (2013.01)

(58) Field of Classification Search
CPC ..... F16B 5/0258; F16B 5/0233; H05K 7/142; H05K 7/1407
See application file for complete search history.

(56) References Cited

U.S. PATENT DOCUMENTS

| | | | | |
|---|---|---|---|---|
| 8,749,985 B2 * | 6/2014 | Chiu | ...................... | H05K 7/142 361/748 |
| 8,861,208 B2 * | 10/2014 | Hwang | .................. | H05K 7/142 361/727 |
| 8,897,026 B2 * | 11/2014 | Duan | ..................... | H05K 7/142 361/728 |
| 9,468,123 B2 * | 10/2016 | Yu | .......................... | H05K 7/142 |
| 2014/0355182 A1 * | 12/2014 | Wang | ..................... | H05K 7/142 361/679.01 |
| 2016/0330849 A1 * | 11/2016 | Brodbeck | ............. | F16B 21/082 |

* cited by examiner

*Primary Examiner* — Daniel J Wiley
(74) *Attorney, Agent, or Firm* — Brinks Gilson & Lione (57) ABSTRACT

A mounting device for fastening a printed circuit board onto a carrier is disclosed. The mounting device comprises at least one bolt that can be screwed onto the printed circuit board, having at least one fastening wing, wherein the fastening wing has at least one interlocking component. Furthermore, the mounting device comprises at least one bolt receiver that is or can be integrated in the carrier. The bolt is or can be disposed in the bolt receiver such that it can be displaced in the direction of a displacement axis that is oriented substantially perpendicular to a main extension plane of the printed circuit board. The bolt receiver comprises at least one groove for receiving at least one subsection of the fastening wing having the interlocking component. The interlocking component is designed to interlock in the groove when the bolt disposed in the bolt receiver is subjected to a predetermined torque.

20 Claims, 7 Drawing Sheets

FIXING DEVICE FOR A CIRCUIT PLATE TO A CARRIER, CIRCUIT ARRANGEMENT AND METHOD FOR FIXING A CIRCUIT PLATE TO A CARRIER

PRIORITY STATEMENT

This application claims the benefit of German Patent Application DE 10 2015 204 120.4, filed Mar. 6, 2015, and incorporates the German Patent Application by reference herein in its entirety.

FIELD

The present disclosure relates to a mounting device for fastening a printed circuit board to a carrier, to a circuit device and to a method for fastening a printed circuit board onto a carrier.

BACKGROUND

A printed circuit board can be screwed onto different components, using screw heads, for example. Due to tolerances, the screw heads may be of different heights. In order to compensate for such height differences, spacers or flexible components such as rubber washers may be used.

With this background, the present disclosure creates a mounting device for fastening a printed circuit board onto a carrier, a circuit device and a method for fastening the printed circuit board onto a carrier, in accordance with the independent claims. Advantageous designs can be derived from the dependent claims, and the following description.

SUMMARY

The approach described herein results in a mounting device for fastening a printed circuit board onto a carrier, wherein the mounting device has the following features:

at least one bolt that can be screwed onto the printed circuit board, having at least one fastening wing, wherein the fastening wing has at least one interlocking component; and at least one bolt receiver that can be or is integrated in the carrier, wherein the bolt can be displaced in the direction of a displacement axis that is aligned substantially perpendicular to a main extension plane of the printed circuit board, wherein the bolt receiver has at least one groove for receiving at least one subsection of the fastening wing exhibiting the interlocking component, wherein the interlocking component is designed to engage in the groove when the bolt disposed in the bolt receiver is subjected to a predetermined torque.

A printed circuit board may be understood to be a circuit carrier that is or can be populated with electrical components. A carrier can, for example, be a housing or a housing part. A bolt can be a substantially cylindrical fastening component. The bolt can be designed as a threaded bolt, for example, having a thread for receiving a screw. Depending on the embodiment, the thread may be an internal or an external thread, or a right- or left-hand thread. If the thread is an external thread, then a screw may also basically be understood to be a nut.

A fastening wing can be understood to be a projection disposed on an outer surface of the bolt. The interlocking component can, for example, be a wedge, an edge, a point, a spike, a hook or some other element, the geometry and material properties of which are suited for connecting the bolt to a material of the bolt receiver in a form-fitting or force-locking manner, when subjected to the torque. Depending on the embodiment, the bolt, the fastening wing and the interlocking component can be produced either as individual components, or as integrated components, in either a molding or milling process.

A bolt receiver can be understood to be a sleeve for guiding the bolt along the displacement axis. A groove can be understood to be, basically, a recess formed in one of the lateral walls of the bolt receiver encompassing the bolt. By way of example, the groove can be a slot opening toward the top in the lateral wall, running substantially parallel to the displacement axis. Depending on the embodiment, the bolt receiver can be bonded, for example, with adhesive to the carrier, or welded thereto, or it can be produced as a component of the carrier.

The interlocking component can be oriented, for example, in a tightening rotational direction of the thread or the screw, in order to engage in a wall surface of the groove that functions as a stop when the screw is tightened with the predetermined torque, i.e. when the bolt is rotated about the displacement axis. For this purpose, the interlocking element may be made from a harder material than the bolt receiver. The predetermined torque can be understood to be a minimum torque that must be applied in order to obtain the interlocking. Depending on the type and size of the screw, or the thread, the torque may be 0.5, 1.2, or 5 newton meters.

The approach described herein is based on the knowledge that a threaded bolt for fastening a printed circuit board onto a housing part in a sleeve functioning as a screw bore, supported such that it can be displaced in a longitudinal direction, and can be secured in the sleeve using a clamping wing during the screwing in a form-fitting or force-locking manner. As a result, height differences between the printed circuit board and housing, due to manufacturing or structural conditions, can already be compensated for during the screwing, such that the least possible warping and the least possible tensions result in the printed circuit board. By means of such a screw bore for compensating for different fastening heights, tolerances occurring at the components screwed to the printed circuit board only play a subordinate role, because the bolts can be adjusted to the actual size for each individual component.

Depending on the material for the threaded bolt and sleeve, the approach presented herein enables a screwing of the printed circuit board onto a housing, without interrupting an electrical connection between the printed circuit board and the housing. By this means, an electrical connection of the printed circuit board to the housing can be implemented with a low manufacturing and installation expenditure, i.e. a ground connection.

According to one embodiment of the proposed approach, the interlocking component can extend longitudinally such that it is substantially parallel to the displacement axis. By way of example, the interlocking component may extend along an outer edge of the fastening wing with a perpendicular orientation, i.e. parallel to a longitudinal axis of the bolt. As a result, the interlocking component can interlock in the groove with the greatest possible surface area, and thus to the most stable extent possible.

It is also advantageous when the longitudinal extension of the interlocking component is substantially transverse to the displacement axis. By way of example, the interlocking component can have a length thereby, which is at least as great as the width of the groove. As a result of an alignment of the interlocking component in this manner, it is possible to effectively prevent the bolt, when in it is in a screwed in state, from sliding along the displacement axis, due to vibrations, for example.

The interlocking component can have a wedge-shaped cross section, i.e. the interlocking component can have a substantially triangular cross section, which can taper toward the tightening rotational direction to form a sharp edge. An interlocking component of this type offers the advantage of a greater stability with respect to mechanical loads, which may occur in the region of the interlocking component, for example, when the bolt is screwed in, thus reducing wear.

In accordance with another embodiment of the approach presented herein, the bolt may be made from an electrically conductive material. Additionally or alternatively, the bolt receiver can also be made from an electrically conductive material. The electrically conductive material can be a metal or an electrically conductive plastic, for example. As a result, an electrical connection of the printed circuit board to the carrier can be implemented without additional wiring.

The mounting device may be provided, for example, with at least one screw for screwing the bolt to the printed circuit board. Accordingly, the bolt may have a thread extending in the direction of the displacement axis for receiving the screw. The bolt can be subjected to the torque by means of the thread and the screw. As has been mentioned above, a screw may be understood to be either a screw or a nut, depending on the embodiment of the thread. In particular, the thread can be an internal thread extending along a central axis of the bolt.

A start of the thread may be located, for example, on an end of the bolt facing toward the printed circuit board. A precise, reproducible, application of the torque to the bolt is enabled with this embodiment.

It is also advantageous when the bolt receiver is a component of the carrier. With an integral design of the bolt receiver and carrier of this type, a robust and permanent connection between the carrier and the bolt receiver is guaranteed. Furthermore, the production costs for the mounting device can be reduced thereby.

It is also conceivable that the bolt receiver has at least one reinforcement rib that is or can be disposed such that it is flush with an edge of the carrier. A reinforcement rib can be understood to be a projection that extends, for example, along the outer surface of the bolt. A length of the reinforcement rib can correspond thereby to a length of the bolt receiver, such that the reinforcement rib is flush with an upper and lower end of the bolt receiver. The bolt receiver can be aligned such that the reinforcement rib is flush with the edge of the carrier, i.e. an outer edge of the carrier. The bolt receiver can be supported against a further housing component, such as a lateral wall thereof, that is to be joined to the edge of the carrier, by means of a reinforcement rib disposed in this manner.

Advantageously, the bolt may have at least one further fastening wing, having at least one further interlocking component, and the bolt receiver may have at least one further groove for receiving at least one subsection of the further fastening wing having the further interlocking component. The fastening wing can be disposed opposite the further fastening wing thereby, and the groove can be disposed opposite the further groove. With this embodiment, the stability of the connection between the bolt and the bolt receiver can be significantly increased with very little additional effort.

The mounting device may be provided with the carrier according to another embodiment of the proposed approach.

Advantageously, the carrier can be a bus bar. A bus bar can be understood in general to be a rigid component, that is designed to conduct an electrical current. As a result, there is no need for a supplementary wiring of the printed circuit board to a current source. In particular, the bolt and the bolt receiver can be made from an electrically conductive material thereby, in order to electrically couple the printed circuit board to the carrier in the form of a bus bar.

The proposed approach furthermore creates a circuit device having the following features:

a printed circuit board; and a mounting device according to one of the embodiments described herein, wherein the bolt is screwed onto the printed circuit board and is secured in the bolt receiver by means of the interlocking component.

Lastly, the proposed approach creates a method for fastening a printed circuit board in a circuit device according to one of the embodiments described herein, wherein the method includes the following steps:

arranging the bolt in the bolt receiver;

screwing the bolt onto the printed circuit board, wherein the bolt is tightened thereto in such a manner that the bolt bears against the printed circuit board; and applying a predetermined torque to the bolt, in order for the interlocking component to interlock with the bolt receiver.

The steps of the arranging and the screwing may be executed in any order.

BRIEF DESCRIPTION OF THE DRAWINGS

The disclosure shall be explained, by way of example, based on the attached drawings. Therein.

DETAILED DESCRIPTION OF EXAMPLE EMBODIMENTS

In the following description of preferred exemplary embodiments of the present disclosure, elements having similar functions and depicted in the various figures shall be given the same or similar reference symbols, wherein the description of these elements shall not be repeated.

Figure 1A:
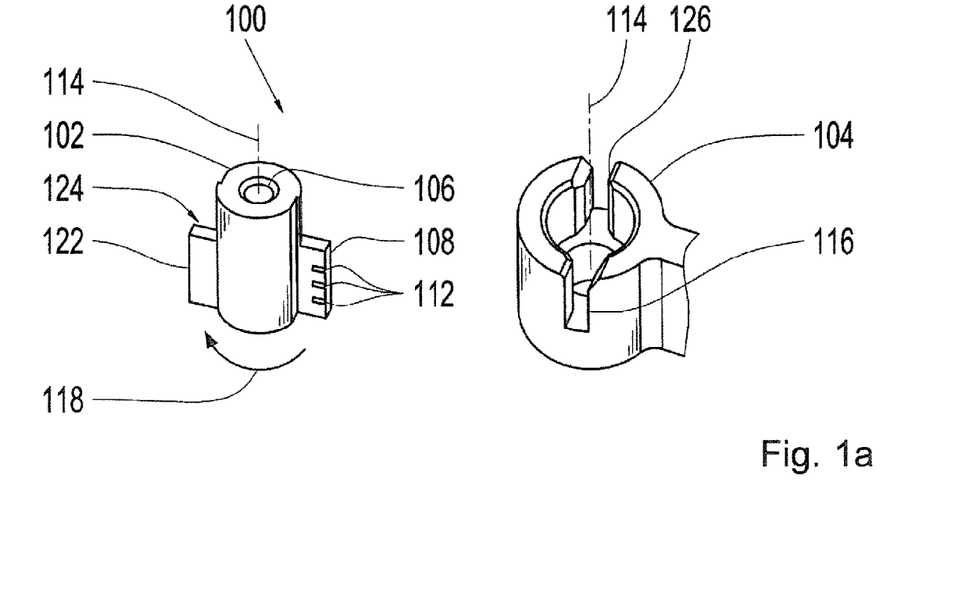
FIGS. 1a, 1b show schematic depictions of a mounting device according to one exemplary embodiment of the present disclosure.
Figure 1B:
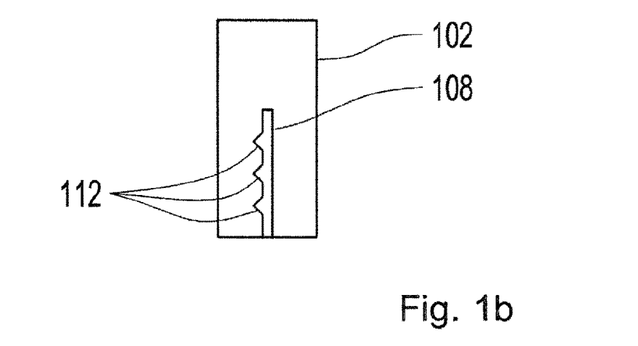

FIGS. 1a and 1b show schematic depictions of a mounting according to one exemplary embodiment of the present disclosure. The mounting device 100 comprises a cylindrical bolt 102 and a sleeve-like bolt receiver 104. For greater clarity, the bolt 102 and the bolt receiver 104 are depicted next to each other in FIG. 1a. The bolt 102 has a thread 106, in this case a right-hand thread, which serves for the screwing of the bolt 102 to a printed circuit board. A fastening wing 108 is disposed on an outer surface of the bolt 102. The fastening wing 108 has, by way of example, three interlocking components 112, which are distributed along a longitudinal edge of the fastening wing 108.

The bolt 102 may be placed in the bolt receiver 104 and displaced along a displacement axis 114 in the bolt receiver 104. The displacement axis 114 comprises an axis that is oriented substantially perpendicular to a main extension plane of the printed circuit board. The bolt receiver 104 is shown in FIG. 1a as a sleeve that can be integrated into a housing. A lateral wall of the bolt receiver 104 has an elongated groove 116, which extends parallel to the displacement axis 114, i.e. along the bolt receiver 104, and is shaped such that it can receive the fastening wing 108 having the three interlocking components 112.

The bolt 102 can be secured in place in the groove 116 at different heights, depending on the vertical spacing of the printed circuit board to the bolt receiver 104. By tightening a screw in the thread 106, a predetermined torque may be applied to the bolt 102. The bolt 102 moves thereby in a tightening direction 118 about the displacement axis 114, such that the interlocking component 112 engages in the groove 116. The tightening direction 118 corresponds to a turning toward the right about the displacement axis 114, according to this exemplary embodiment.

The thread 106 extends along the displacement axis 114 according to the exemplary embodiment shown in FIGS. 1a and 1b, which displacement axis corresponds to the central axis of the bolt 102.

The three interlocking components 112 may be disposed on a side of the fastening wing 108 facing toward the tightening direction 118, and have a wedge-shaped cross section, which tapers to a sharp edge in the direction of the tightening direction, as can be seen in FIG. 1b. As is depicted in FIG. 1a, the interlocking elements 112 can extend longitudinally, substantially transverse to the displacement axis 114.

Figure 3:
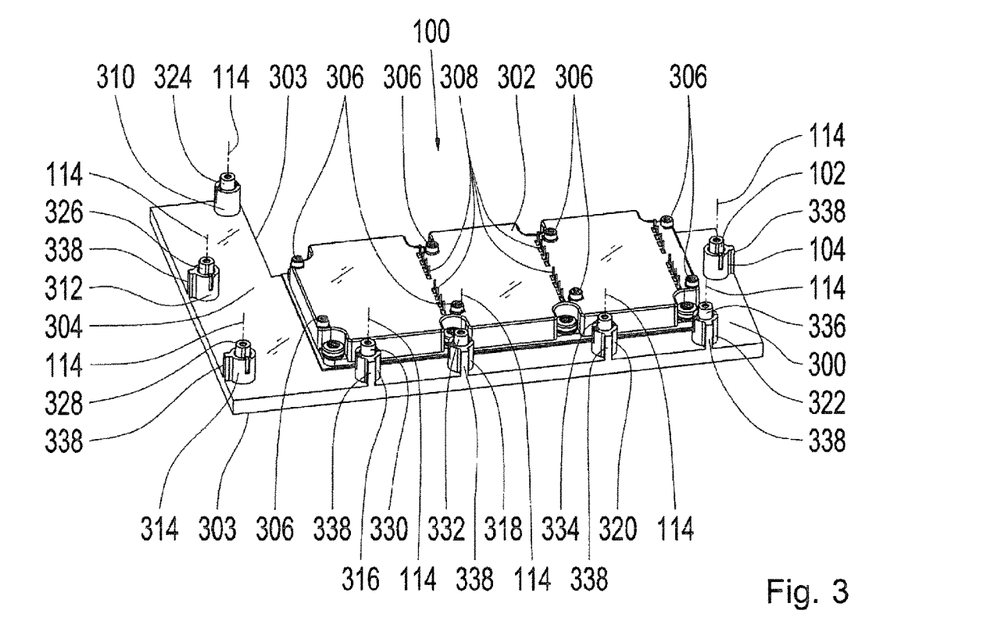
FIG. 3 shows a schematic depiction of a mounting device having a carrier according to one exemplary embodiment of the present disclosure.

The fastening wing 108 has a rectangular design, by way of example, and is shorter than the bolt 102. Depending on the embodiment, the fastening wing 108 can be basically as high as the groove 116, by way of example, such that the fastening wing 108, when in the installed state of the bolt 102, is flush with the upper edge of the groove 116, as is shown in FIG. 3, among others. Furthermore, the fastening wing 108 may be positioned on the outer surface of the bolt 102 such that the fastening wing 108 is flush with an end of the bolt 102 that faces away from the thread 106.

As is shown in FIGS. 1a and 1b, the bolt 102 can also comprise, in addition to the fastening wing 108, a further fastening wing 122, disposed on a side of the bolt 102 lying opposite the fastening wing 108. The additional fastening wing 122 may be designed, in a manner analogous to that of the fastening wing 108, having at least one additional interlocking component 124, which may be designed in a manner analogous to the interlocking component 112 described above. The at least one additional interlocking component 124 is disposed in FIGS. 1a and 1b on a side of the additional fastening wing 122 facing away from the viewing plane.

Accordingly, the lateral wall of the bolt receiver 104 can have an additional groove 126 lying opposite the groove 116, for receiving the additional fastening wing 122. The additional groove 126 can be formed, for example, in a manner that is described above with reference to the groove 116.

As is shown in FIG. 1a, it is advantageous when the upper edges of the two grooves 116, 126 are beveled. By this means, a twisting of the fastening wings 108, 122 in the grooves 116, 126 can be prevented when the bolts 102 are inserted in the bolt receivers 104.

Depending on the embodiment, the bolt 102 or the bolt receiver 104 can be made from an electrically conductive material, in particular a metal. It is also conceivable that they are made from an electrically conductive plastic.

According to one embodiment, the mounting device 100 comprises a screw bore, composed of a sleeve, as the bolt receiver 104, and a threaded bolt 102 having the fastening wing 108, also referred to as a clamping wing, and clamping lugs as the interlocking components 112. The fastening wing 108 serves to compensate for height differences between components that are to be screwed to the printed circuit board when the printed circuit board it screwed in place, without interrupting an electrical connection between the printed circuit board and a housing, and without subjecting the printed circuit board to tensions as a result of the different heights of the fastening points. The height differences result, for example, because the fastening points are located on different components, or have higher tolerances.

Figure 2:
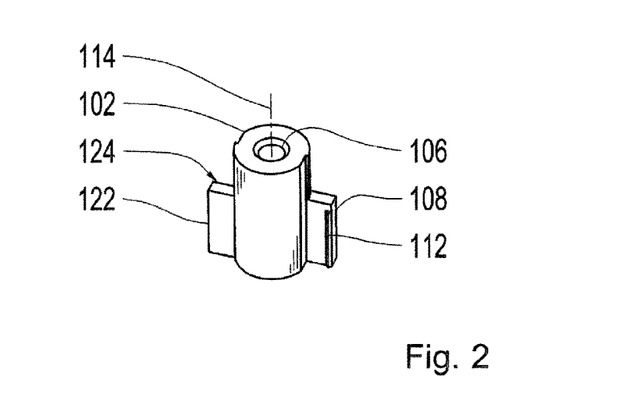
FIG. 2 shows a schematic depiction of a bolt according to one exemplary embodiment of the present disclosure.

FIG. 2 shows a schematic depiction of a bolt 102 according to one exemplary embodiment of the present disclosure. FIG. 2 shows a variation having only one perpendicular clamping lug 112 for each fastening wing 108. The bolt 102 corresponds substantially to the bolt described in reference to FIGS. 1a and 1b, with the difference that the fastening wing 108 has only one interlocking element 112 instead of three. In contrast to the variant described in reference to FIGS. 1a and 1b, having three horizontal clamping lugs 112 for each fastening wing 108, the interlocking component 112 extends along the outer edge of the fastening wing 108. The interlocking component 112 is thus oriented substantially parallel to the displacement axis 114. As with the interlocking component described above, the interlocking component 112 shown in FIG. 2 may also have a wedge-shaped cross section.

FIG. 3 shows a schematic depiction of a mounting device 100 with a carrier 300 according to one exemplary embodiment of the present disclosure. The carrier 300 is depicted as an L-shaped housing plate. A component 302 having a rectangular base is located on the carrier 300. The carrier extends at three sides of the component 302 beyond the base of the component 302. A longitudinal side of the component 302 is disposed such that it borders on an outer edge 303 of the carrier 300. The component 302 is thus positioned on the carrier 300 such that the carrier 300 forms a substantially C-shaped carrier rim 304 around the component 302.

Alternatively, the carrier can also be implemented as a rigid bus bar.

The component 302 is screwed securely to the carrier 300 and has numerous support points 306 on a surface lying opposite the carrier 300. The support points 306 are distributed along a rim region of the component 302 and function as support points for a printed circuit board that is to be fastened to the carrier 300, which can be screwed onto the carrier 306 with the component 302. The component 302 has numerous contact circuit points 308 for an electrical contact to the printed circuit board, which are depicted, by way of example, as plug-in contacts.

The bolt receiver 104 as well as seven other bolt receivers 310, 312, 314, 316, 318, 320, 322, by way of example, are distributed around the component 302 in the carrier rim 304. A bolt 102, for example, is placed in the bolt receiver 103, as described above in reference to FIG. 1a. The bolt 102 extends thereby a little bit above the bolt receiver 104. Likewise, a bolt 324, 326, 328, 330, 332, 334, 336 is placed in each of the bolt receivers 310, 312, 314, 316, 318, 320, 322. The other bolts and the other bolt receivers may be designed in the manner described above, in reference to the bolt 102, or the bolt receiver 104.

The bolt receivers 104 to 322, having the bolts 102 to 336 located therein, serve as, in addition to the support points 306, additional fastening points for fastening the printed circuit board to the carrier 300. According to one exemplary embodiment, the bolt receivers are designed as housing sleeves, i.e. as a part of the carrier 300 functioning as the housing.

According to the exemplary embodiment shown in FIG. 3, each of the bolt receivers 104 to 322 is formed having a reinforcement rib 338, which extends along a respective outer surface of the respective bolt receiver parallel to the displacement axis 114. The bolt receivers are oriented such that an outer edge of each reinforcement rib 338 lying opposite the outer surface is flush with the outer edge 303 of the carrier 300, as is visible, in particular, in FIGS. 6a to 6c.

According to one exemplary embodiment, the bolts 102 to 336 can be placed in their respective bolt receivers prior to an installation of the printed circuit board. Alternatively, the bolts can be fastened to the printed circuit board with reduced force, and a pre-fixing thereof. A pre-installation of this type is suitable, in particular, for uses with few screwing positions.

Figure 4A:
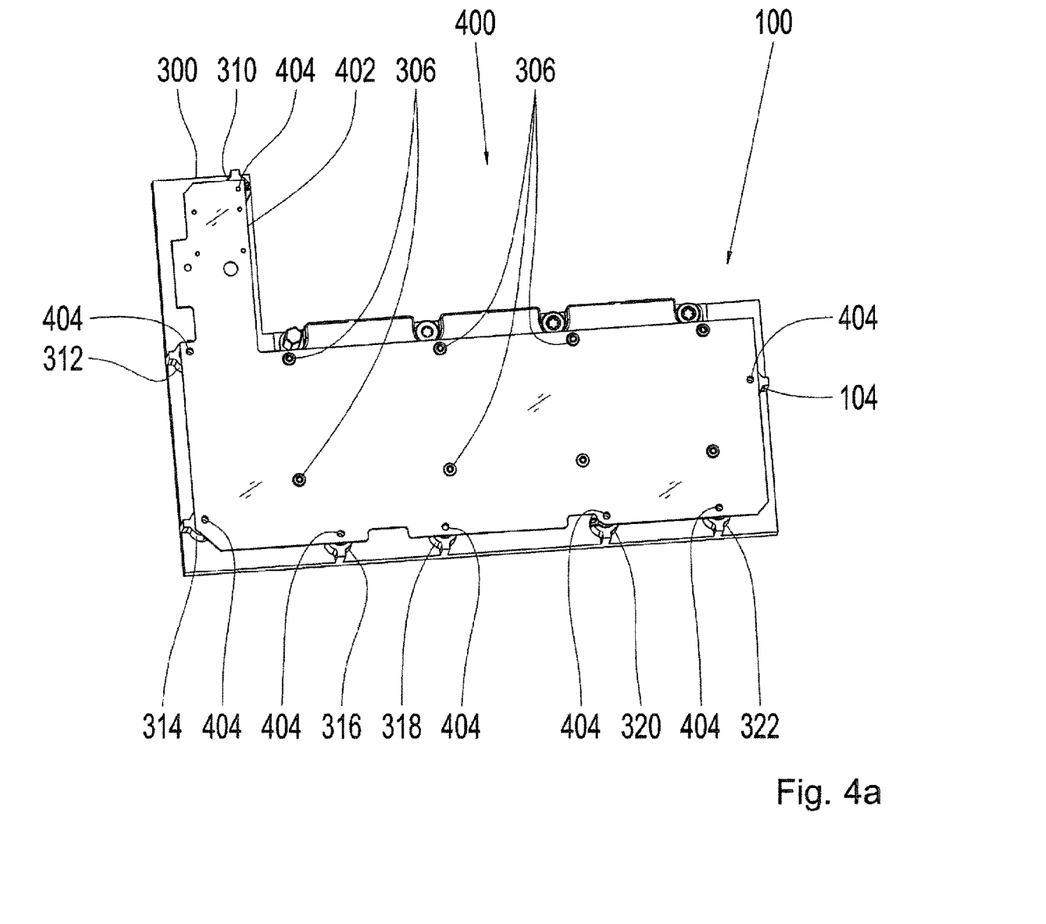
FIGS. 4a, 4b, 4c show schematic depictions of a circuit device according to one exemplary embodiment of the present disclosure.
Figure 4B:
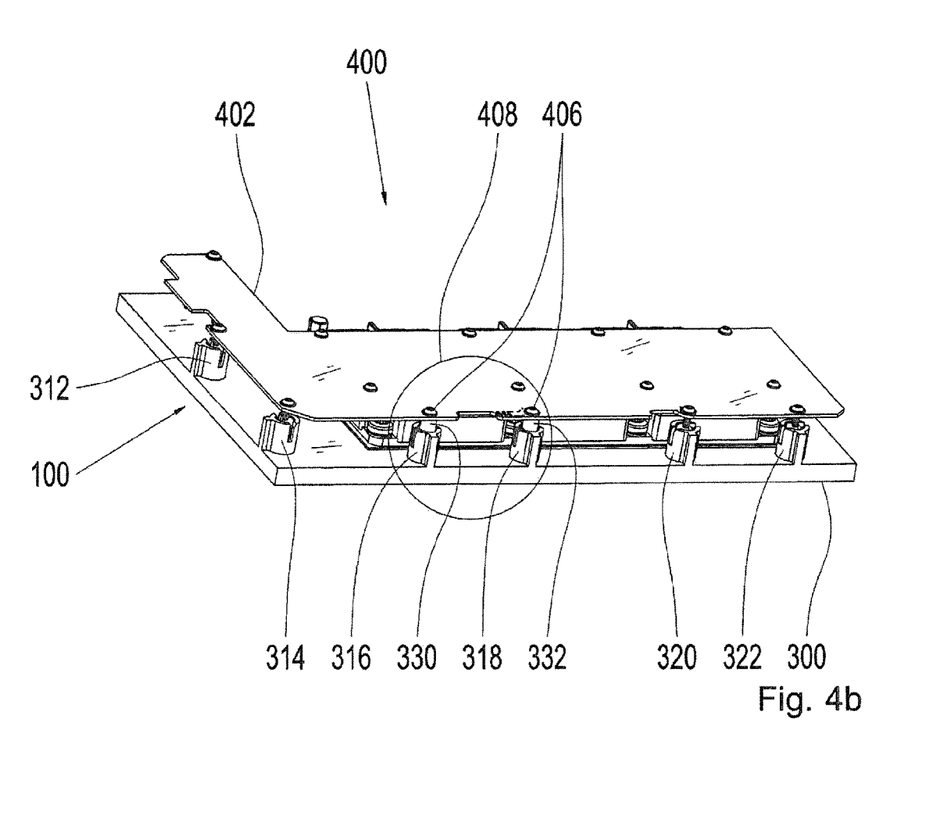
Figure 4C:
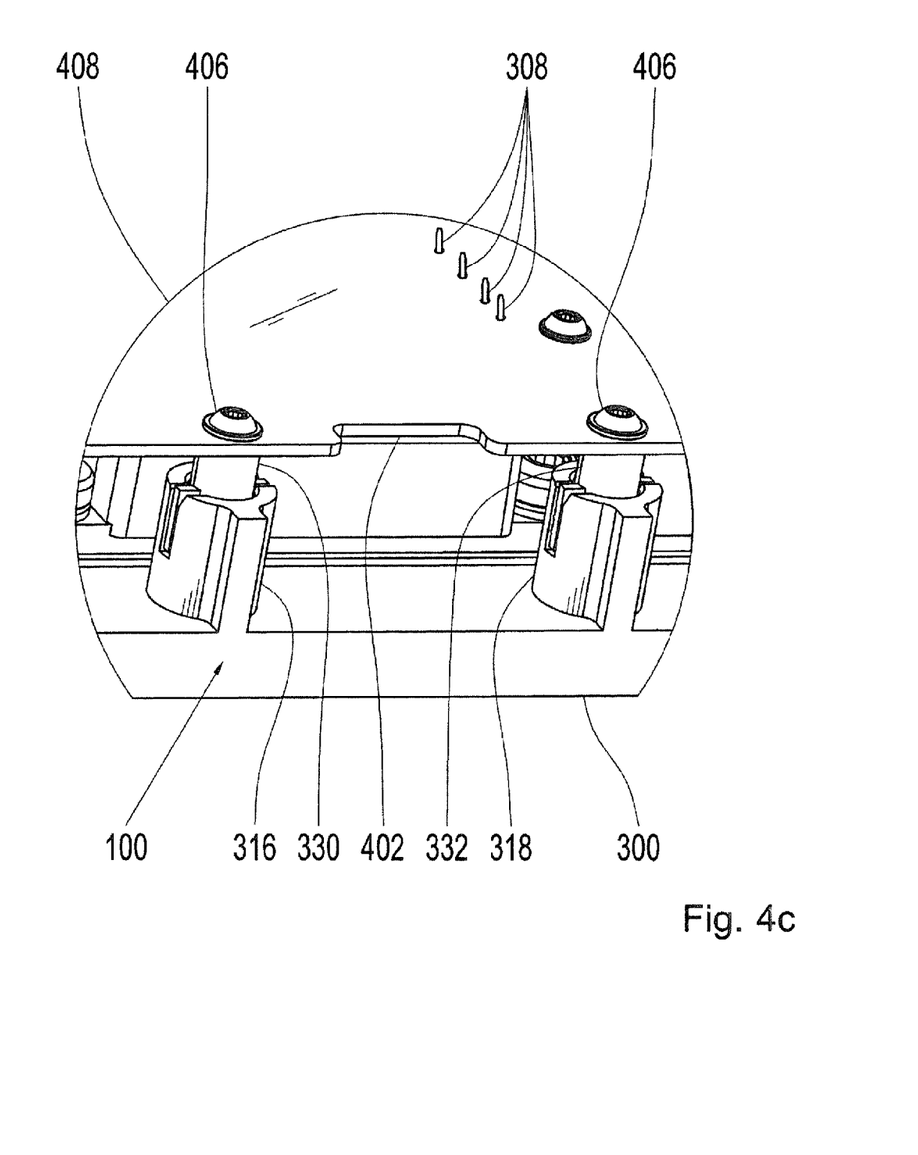

FIGS. 4a to 4c show schematic depictions of a circuit device 400 according to one exemplary embodiment of the present disclosure.

The circuit device 400 comprises the mounting device 100 described above based on FIG. 3, having the carrier 300 as well as a printed circuit board 402, which is screwed to the carrier 300 via the support points 306. The printed circuit board 402 has a substantially L-shaped base, the proportions of which basically correspond to the proportions of the base of the carrier 300. According to this exemplary embodiment, the printed circuit board 402 has eight fastening points 404, by way of example, for screwing the printed circuit board 402 with the bolts onto the mounting device 100. The printed circuit board 402 is positioned on the carrier 300 such that each fastening hole 404 lies opposite a bolt receiver.

FIG. 4a shows the circuit device 400 in a top view. The bolt receivers 104, 310, 312, 314, 316, 318, 320, 322 are covered, for the most part, by the printed circuit board 402. The printed circuit board 402 is only screwed to the carrier 300 at the support points 306.

In FIG. 4b, the circuit device 400 is shown in a side view. By way of example, the printed circuit board 402 is screwed to the bolt 330 and the bolt 332 by means of two screws 406 inserted through corresponding fastening holes. A fastening region 408 comprising the two bolts 330, 332 is marked with a circle. Due to the tightening torque of the screws 406, the respective interlocking components on the bolts 330, 332 press into the sleeves of the corresponding bolt receivers 316, 318. Together with the contact pressure, the level of the printed circuit board 402 is ensured thereby. The respective interlocking components of the two bolts 330, 332 may have different shapes, depending on the embodiment.

The rest of the fastening receivers 312, 315, 320, 322 visible in FIG. 4b, lying outside the fastening region 408, are depicted without bolts, by way of example.

FIG. 4c shows an enlarged depiction of the fastening region 408 marked in FIG. 4b, having the two bolts 330, 332, which are screwed to the printed circuit board 402 by means of the screws 406, and secured in the associated bolt receivers 316, 318, by means of the interlocking components. Likewise, a portion of the plug-in contacts 308 described above in reference to FIG. 3, can be seen in FIG. 4c, which extend through the printed circuit board 402 in order to establish electrical contact therewith.

Figure 5A:
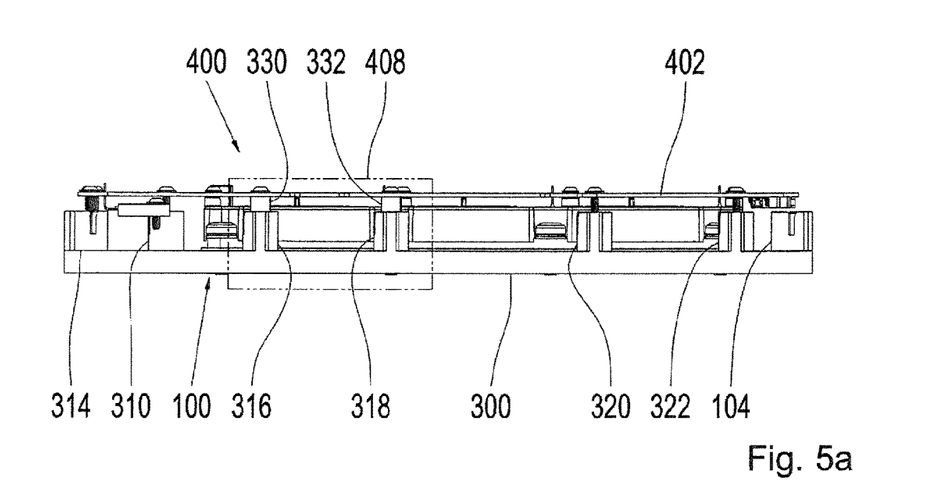
FIGS. 5a, 5b show schematic depictions of a circuit device according to one exemplary embodiment of the present disclosure, in a side view.
Figure 5B:
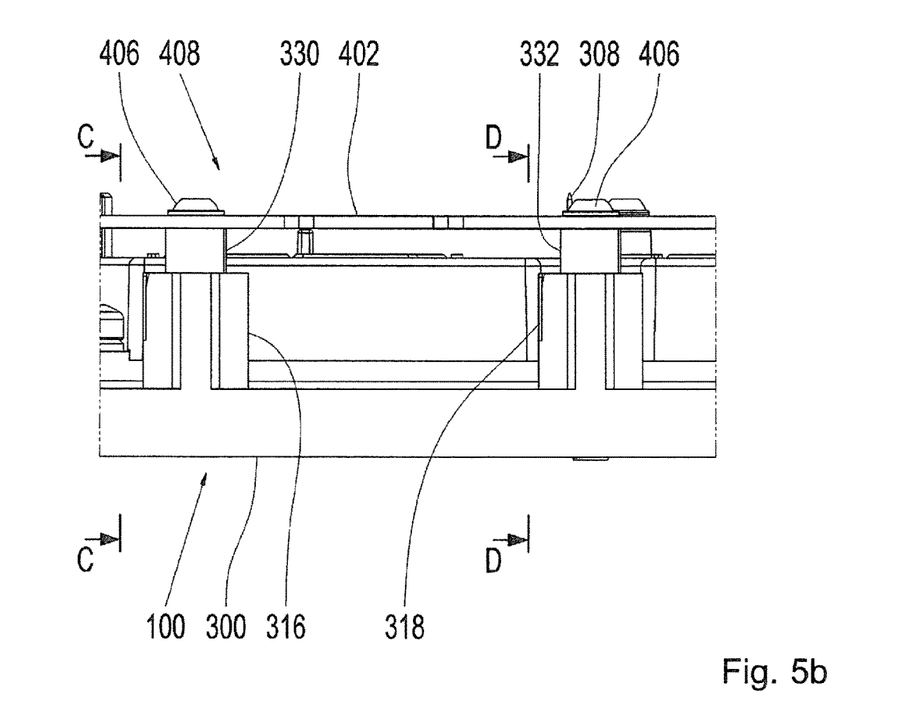

FIGS. 5a and 5b show schematic depictions of a circuit device 400 according to one exemplary embodiment of the present disclosure, in a side view. An overall view of a circuit device 400, as described above in reference to FIGS. 4a to 4c, is depicted in FIG. 5a. Visible are the mounting device 100 with the carrier 300, the fastening region 409, the bolt receivers 104, 310, 314, 320, 322 located outside the fastening region 409, and the printed circuit board 402.

FIG. 5b shows an enlarged side view of the fastening region 408 marked in FIG. 5a.

Figure 6A:
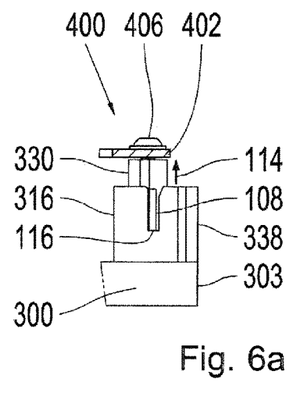
FIGS. 6a, 6b, 6c show schematic depictions of details of a circuit device according to one exemplary embodiment of the present disclosure in various sectional views.
Figure 6B:
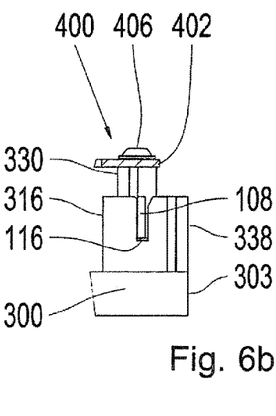
Figure 6C:
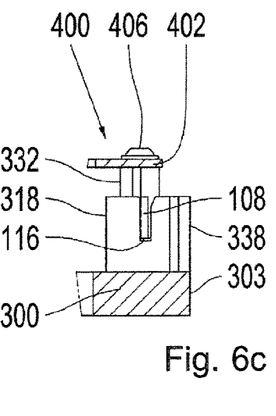

FIGS. 6a to 6c show schematic depictions of subsections of a circuit device 400 according to one exemplary embodiment of the present disclosure, in various sectional views. FIGS. 6a and 6b show a section through the circuit device 400 along a cutting line C-C drawn in FIG. 5b.

FIG. 6a shows a first installation state, in which the bolt 330 is loosely screwed onto the printed circuit board 402, and thus is not yet braced against the printed circuit board 402. By turning the screw 406 in the tightening direction, the bolt 330 is first pulled against the printed circuit board 402, i.e., depending on the vertical spacing between the printed circuit board 402 and the bolt receiver 316, raised a bit out of the bolt receiver, until it rests against the printed circuit board 402. The height adjustment of the bolt 330 along the displacement axis 114 caused by turning the screw 406 is indicated by an arrow.

FIG. 6b shows a second installation state, in which the bolt 330 is braced against the printed circuit board 402. If the tightening torque of the screw 406 in the second installation state increases to a predefined value, then the fastening wing 108 in the groove 116 is pressed against the bolt receiver 316 with such a force that the interlocking components engage in the bolt receiver 316 in a form-fitting and force-locking manner. As a result, the printed circuit board 402 is anchored in the bolt receiver 316 against vibrations.

A sectional view of the circuit device 400 along a cutting line D-D drawn in FIG. 5b is depicted in FIG. 6c. Shown therein are the bolt receiver 318 and the bolt 332 screwed by means of the screw 406 to the printed circuit board 402.

The installation state shown in FIG. 6c corresponds, by way of example, to the second installation state described in reference to FIG. 6b.

Figure 7:
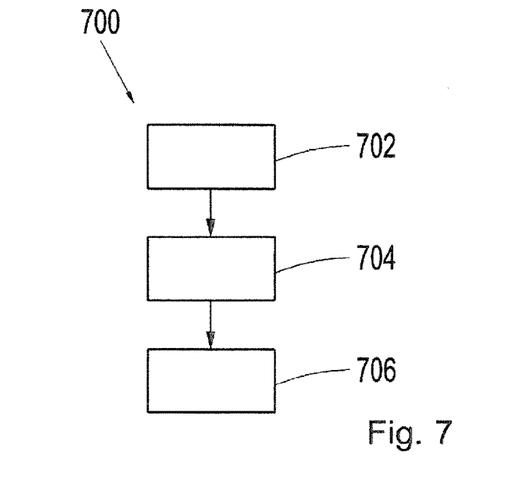
FIG. 7 shows a flow chart for a method for fastening a printed circuit board into a circuit device according to one exemplary embodiment of the present disclosure.

FIG. 7 shows a flow chart for a method 700 for mounting a printed circuit board in a circuit device according to one exemplary embodiment of the present disclosure. The method 700 can, by way of example, be executed using a circuit device described above.

In a step 702, the bolt is arranged in the bolt receiver, wherein the bolt receiver can be secured to a carrier, such as a housing. The bolt is placed in the bolt receiver such that at least a subsection of the fastening wing projecting from the bolt, that comprises the interlocking component, is located in a corresponding groove of the bolt receiver.

In a Step 704, the bolt is screwed to the printed circuit board. The bolt is tightened thereby until it is braced against the printed circuit board. Step 704 may be executed before or after Step 702, depending on the embodiment.

Lastly, a predetermined torque is applied to the bolt in Step 706. As a result, the fastening wing is twisted into the groove with such a force that the interlocking component interlocks with the bolt receiver.

According to one exemplary embodiment, the at least one bolt for the height compensation is inserted in a sleeve in Step 702, which is integrated in a housing into which the printed circuit board is to be screwed. The sleeve functions thereby as a bolt receiver. The bolt can be designed such that it always lies deeper than the printed circuit board, taking tolerances into account. The printed circuit board can already be screwed onto an adjacent component.

In Step 704, the screwing of the bolt can occur such that in the z-axis, i.e. perpendicular to a main extension plane of the printed circuit board, the screw is subjected to no, or only slight, force. As a result of the screw being screwed into the bolt, without exerting a perpendicular force on the screw toward the printed circuit board, the bolt is first pulled against the printed circuit board in a first step, i.e. it is pressed against the printed circuit board from below, wherein the height of the printed circuit board is set.

The connection between the bolt and the housing occurs in a second step that corresponds to Step 706, via a torque exerted by a screwdriver on the screw, by means of which the clamping lugs on the respective wings of the bolt are pressed into the housing, and pressed against it. As a result, a form-fit is obtained between the bolt and the housing, which secures the connection in terms of height against vibrations.

A screwing of the printed circuit board onto a rigid component, such as a bus bar, is also conceivable, which may make a grounding to the housing necessary. The bolt may also serve, in this case, to compensate for a height difference caused by tolerances, without subjecting the printed circuit board to tension. As long as the bolt and the bolt receiver are made from an electrically conductive material, in accordance with an exemplary embodiment described above, there is no need to connect the printed circuit board via a wiring.

Alternatively, with printed circuit boards having few fastening positions, the threaded bolt can be preplaced with very little force on the printed circuit board. The bolt can be prepositioned thereby, with a suitable pin, in the printed circuit board. The screw in Step 706 is first tightened with the predefined torque to its final position when the printed circuit board is installed in the housing, such that the bolt is pressed against the housing with a defined force.

The exemplary embodiments shown in the figures and described herein are selected only by means of example. Different exemplary embodiments can be combined, entirely or with respect to individual features, with one another. Moreover, one exemplary embodiment may be supplemented with features of another exemplary embodiment. Furthermore, method steps according to the disclosure can be repeated, as well as executed in a different sequence than that described herein.

If an exemplary embodiment comprises an "and/or" conjunction between a first feature and a second feature, then this can be read to mean that the exemplary embodiment has the first feature as well as the second feature in accordance with one embodiment, and, in accordance with another embodiment, has either only the first feature or only the second feature.

REFERENCE SYMBOLS 100 mounting device
102 bolt
104 bolt receiver
106 thread
108 fastening wing
112 interlocking component
114 displacement axis
116 groove
118 tightening rotation direction
122 further fastening wing
124 further interlocking component
126 further groove
300 carrier
302 component
303 outer edge of the carrier
304 carrier rim
306 support point
308 contact circuit point
310 further bolt receiver
312 further bolt receiver
314 further bolt receiver
316 further bolt receiver
318 further bolt receiver
320 further bolt receiver
322 further bolt receiver
324 further bolt
326 further bolt
328 further bolt
330 further bolt
332 further bolt
334 further bolt
336 further bolt
338 reinforcement rib
400 circuit device
402 printed circuit board
404 fastening hole
408 fastening region
700 mounting method
702 arrangement step
704 screwing step
706 application of torque step

The invention claimed is:

1. A mounting device for fastening a printed circuit board to a carrier, wherein the mounting device comprises:
   at least one bolt configured to be screwed to the printed circuit board, having at least one fastening wing, wherein the fastening wing has at least one interlocking component; and
   at least one bolt receiver configured to be integrated in the carrier, wherein the bolt is configured to be disposed in the bolt receiver such that it can be displaced in the direction of a displacement axis that is oriented substantially perpendicular to a main extension plane of the printed circuit board, wherein the bolt receiver has at least one groove for receiving at least one of a subsection of the fastening wing having the interlocking component, wherein the interlocking component is configured to engage with the groove when a predetermined torque is applied to the bolt disposed in the bolt receiver.

2. The mounting device according to claim 1, wherein the interlocking component extends longitudinally, substantially parallel to the displacement axis.

3. The mounting device according to claim 1, wherein the interlocking component extends longitudinally, substantially transverse to the displacement axis.

4. The mounting device according to claim 3, further comprising a second interlocking component and a third interlocking component, wherein the second interlocking component is displaced from the first interlocking component and the third interlocking component is displaced from the second interlocking component, and wherein the second and third interlocking components extend longitudinally, substantially transverse to the displacement axis.

5. The mounting device according to claim 1, wherein the interlocking component has a wedge-shaped cross section.

6. The mounting device according to claim 1, wherein the bolt and the bolt receiver are made from an electrically conductive material.

7. The mounting device according to claim 1, further comprising at least one screw for tightening the bolt to the printed circuit board, wherein the bolt has a thread extending in the direction of the displacement axis for receiving the screw, wherein the bolt can be subjected to the torque when the screw is turned while engaging the thread.

8. The mounting device according to claim 7, wherein the thread is an internal thread extending within a cavity within the bolt, wherein the cavity extends in the direction of the displacement axis.

9. The mounting device according to claim 1, wherein the bolt receiver is a part of the carrier.

10. The mounting device according to claim 1, wherein the bolt receiver has at least one reinforcement rib that is disposed flush with an edge of the carrier.

11. The mounting device according to claim 1, wherein the bolt has at least one further fastening wing having at least one further interlocking component, and the bolt receiver has at least one further groove for receiving at least one subsection of the further fastening wing having the further interlocking component, wherein the fastening wing is disposed opposite the further fastening wing and the groove is disposed opposite the further groove.

12. The mounting device according to claim 11, wherein the interlocking component and the at least one further interlocking component are disposed on sides of the fastening wing and further fastening wing that face opposite directions.

13. The mounting device according to claim 1, wherein the mounting device comprises the carrier.

14. The mounting device according to claim 13, wherein the carrier is a bus bar.

15. A circuit device comprising:
a printed circuit board; and
a mounting device according to claim 13, wherein the bolt is screwed onto the printed circuit board, and is secured there by the interlocking component in the bolt receiver.

16. A method for fastening a printed circuit board in a circuit device according to claim 15, wherein the method comprises the following steps:
arranging the bolt in the bolt receiver;
screwing the bolt onto the printed circuit board, wherein the bolt is screwed on such that the bolt rests against the printed circuit board; and
applying a predetermined torque to the bolt, in order to engage the interlocking component with the bolt receiver.

17. The method according to claim 16, further comprising the step of raising the bolt out of the bolt receiver.

18. The mounting device according to claim 1, wherein the bolt or the bolt receiver is made from an electrically conductive material.

19. The mounting device according to claim 1, wherein the fastening wing is the same height as the groove.

20. The mounting device according to claim 1, wherein upper edges of the groove are beveled.

* * * * *